United States Patent
Eibert et al.

(10) Patent No.: US 8,184,051 B2
(45) Date of Patent: May 22, 2012

(54) METHOD AND ARRANGEMENT FOR MEASURING THE DIRECTIONAL CHARACTERISTIC OF AN ANTENNA TO BE TESTED

(75) Inventors: Thomas Eibert, Munich (DE); Torsten Fritzel, Munich (DE); Carsten Schmidt, Munich (DE); Hans-Juergen Steiner, Munich (DE)

(73) Assignee: Astrium GmbH, Taufkirchen (DE)

( * ) Notice: Subject to any disclaimer, the term of this patent is extended or adjusted under 35 U.S.C. 154(b) by 139 days.

(21) Appl. No.: 12/768,919

(22) Filed: Apr. 28, 2010

(65) Prior Publication Data

US 2010/0271262 A1 Oct. 28, 2010

(30) Foreign Application Priority Data

Apr. 28, 2009 (DE) .................. 10 2009 018 925

(51) Int. Cl.
*H01Q 3/00* (2006.01)
(52) U.S. Cl. ....................................................... 342/360
(58) Field of Classification Search .................. 342/147, 342/153, 360, 437, 443, 445
See application file for complete search history.

(56) References Cited

U.S. PATENT DOCUMENTS

| | | | |
|---|---|---|---|
| 5,515,378 | A | 5/1996 | Roy et al. |
| 6,140,960 | A | 10/2000 | Kitayoshi |
| 6,686,873 | B2 * | 2/2004 | Patel et al. ........... 342/174 |
| 2003/0142023 | A1 | 7/2003 | Djuknic |
| 2006/0055592 | A1 | 3/2006 | Leather et al. |
| 2006/0057985 | A1 * | 3/2006 | Woo et al. ............ 455/147 |

FOREIGN PATENT DOCUMENTS

| | | |
|---|---|---|
| DE | 19807208 a1 | 9/1998 |
| DE | 102004037718 a1 | 2/2006 |
| DE | 60218223 t2 | 12/2007 |
| FR | 2534380 a1 | 4/1984 |

OTHER PUBLICATIONS

European Search Report for EP10004236 mailed on Aug. 18, 2010.
Las-Heras et al., Echo Identification and Cancellation Techniques for Antenna Measurement in Non-Anechoic Test Sites, IEEE Antennas and Propagation Magazine, 20040201 IEEE Service Center, Piscataway, NJ, US—ISSN 1045-9243, vol. 46, Nr: 1, pp. 100-107, XP011112504.
Potter et al., Modeling of Near-Field Sources in the Finite-Difference Time-Domain (FDTD), Aerospace Conference, 2001, IEEE Proceedings. Mar. 10-17, 2001, 20010320; 20010320-20010317 Piscataway, NJ, USA, IEEE—ISBN 978-0-7803-6599-5 ; ISBN 0-7803-6599-2, vol. 2, pp. 885-891, XP010548312.
Schirrmacher et al., Rechnergestuetztes Verfahren fur die Bestimmung der Richtdiagramme von Antennen in reflektierender Umgebung, Nachrichtentechnik Elektronik, 19930701 VEB Verlag Technik. Berlin, DE-ISSN 0323-4657, vol. 43, Nr. 4, pp. 191-196, XP000466095.

* cited by examiner

*Primary Examiner* — Dao Phan
(74) *Attorney, Agent, or Firm* — Leydig, Voit & Mayer, Ltd.

(57) ABSTRACT

A method of measuring a directional graph of a test antenna includes disposing a plurality of measuring probes relative to the test antenna, each being disposed at a different first predetermined height above a reference plane; disposing the test antenna at a second predetermined height above the reference plane; measuring transmission characteristics relative to the test antenna between each of the plurality of measuring probes and the test antenna; determining prevailing scatter characteristics of the reference plane; and determining the directional graph of the test antenna using the prevailing scatter characteristics.

21 Claims, 1 Drawing Sheet

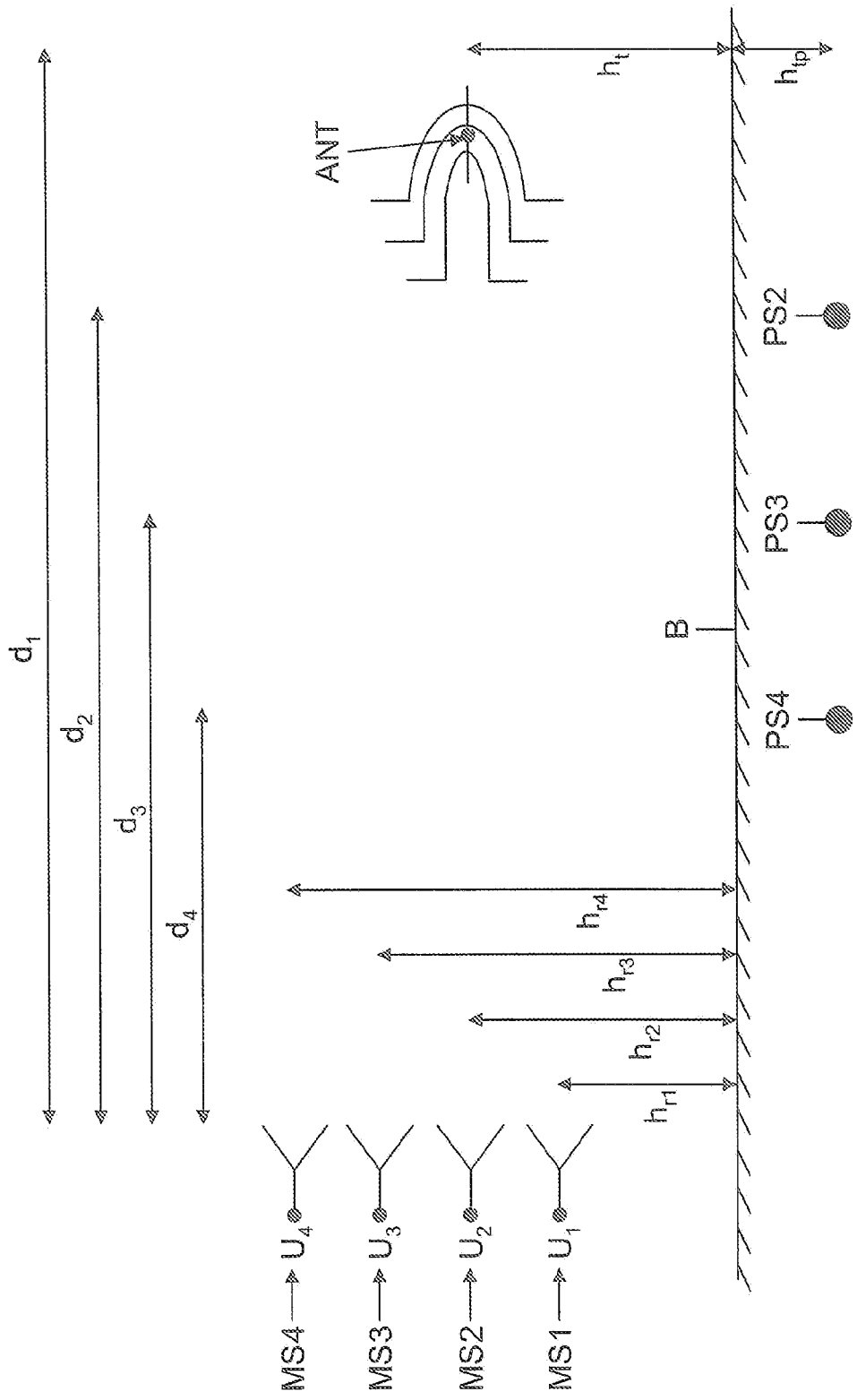

METHOD AND ARRANGEMENT FOR MEASURING THE DIRECTIONAL CHARACTERISTIC OF AN ANTENNA TO BE TESTED

Priority is claimed to German Patent Application No. DE 10 2009 018 925.4-35, filed Apr. 28, 2009, the entire disclosure of which is incorporated by reference herein.

The invention relates to a method and an arrangement for measuring the directional characteristic of an antenna to be tested, referred to below as a test antenna.

BACKGROUND

When characterising electromagnetic fields, the problem of disruptive field contributions generally occurs. This problem occurs because superposition of a wave emitted directly from an antenna with wave portions which are scattered by the ground sometimes leads to significant measurement errors. The relatively large distance (measurement distance) between a measuring probe and the test antenna to be measured results in a shallow angle of incidence of the directly generated wave on the ground. This problem occurs in particular with so-called antenna far field measuring systems. As a result, the directional graph of the test antenna cannot be measured directly because of the field portions which are scattered on the ground.

In order to improve the measuring method, it is therefore desirable to suppress the portions of the measurement signal scattered on the ground. This is achieved, for example, by the measuring probe and the test antenna being arranged so as to be elevated relative to the ground in order to achieve the longest possible time delay before the signal emitted is detected by the receiver. The suppression of the field portions scattered on the ground is carried out, for example, by means of high-speed switches.

Alternatively, so-called vertical probing of the measuring probe is known in order to determine the undulation produced by the superposition of the direct and scattered signal portion and to take this into consideration globally as a correction variable in the measured antenna graphs.

Another method for suppressing field portions which are scattered on the ground involves placing scatter bodies which are as irregular and absorbent as possible along the ground in order to prevent signal portions which are reflected in a specular manner on the ground.

However, none of the methods known from the prior art is capable of completely preventing the superposition of the direct signal portion with the signal portions scattered by the ground and so any measurement is still prone to errors. In particular in the case of shallow angles of incidence on the ground, it is barely possible to suppress the scattered field portions effectively or to eliminate them from the measurement result.

SUMMARY OF THE INVENTION

An aspect of the present invention is therefore to provide a method and an arrangement for measuring the directional graph of a test antenna, by means of which a directional graph of the test antenna is determined in a simple and more precise manner.

The invention provides a method for measuring the directional graph of a test antenna. In this method, a plurality of measuring probes are arranged relative to the test antenna. The test antenna is arranged at a predetermined height above a reference plane, in particular ground level. Accordingly, the plurality of measuring probes are each arranged at a predetermined height above the reference plane. A measurement of the transmission characteristics relative to the test antenna is taken between all the measuring probes and the test antenna. There is in particular a measurement in accordance with magnitude and phase. From this, the scatter characteristics with respect to the reference plane prevailing at the measurement time are determined and taken into consideration when the directional graph of the test antenna is determined.

The invention further provides an arrangement for measuring the directional graph of a test antenna, comprising a plurality of test probes which are arranged relative to the test antenna, the test antenna being arranged at a predetermined height above a reference plane, in particular ground level, and the plurality of measuring probes each being arranged at a predetermined height above the reference plane. The arrangement comprises a means which is constructed to carry out a measurement of the transmission characteristics relative to the test antenna between all the measuring probes and the test antenna and to determine the scatter properties of the reference plane prevailing at the respective measurement time and to take these into account when the directional graph of the test antenna is measured.

The use of a plurality of measuring probes which are arranged relative to the test antenna allows the use of a parametric model, based on which the scatter field portions can be minimised or suppressed. Measurement using a plurality of measuring probes makes it possible to take into account the prevailing scatter properties of the reference plane, generally the ground, which change over time. This is particularly advantageous because the scatter properties can change significantly and temporarily, for example because of moisture or vegetation changes over the course of a year. This property differentiates the method according to the invention from the methods which are known from the prior art and which in particular cannot take into account changes in the ground in order to eliminate or suppress the scatter properties.

According to an advantageous configuration, the signal portions which are scattered at the reference plane are suppressed with respect to the signal amplitude. To this end, the arrangement comprises a corresponding means with which the signal portions scattered on the ground can be suppressed with respect to the signal amplitude.

According to another configuration, for the computer-assisted determination of the scatter properties (that is to say, the disruptive signal portions) of the reference plane, one or more parasitic emitters with unknown radiation amplitude and phase are assumed to be representative of the reference plane. In this context, it is advantageous for the test antenna not to be substantially coupled to the ground. This means that the test antenna is intended to be fitted at a sufficiently high level and above the reference plane. In this instance, the precise height between the reference plane and test antenna can be determined by the person skilled in the art using simple tests. In particular, provision is made for the parasitic emitters to be or become arranged so as to be distributed between the test antenna and measuring probes. For example, the parasitic emitters can be arranged so as to be distributed evenly between the test antenna and the measuring probes.

In an advantageous configuration, n+1 linearly independent measurement values are received by n+1 measuring probes, n representing the number of parasitic emitters assumed. A linear equation system with a corresponding number of coefficients is produced. Subsequently, the radiation amplitudes of the direct signal portion of the test antenna and/or the signal of the parasitic emitters representing the indirect signal portion are determined from the linear equation system. These method steps are carried out by the means mentioned in the introduction of the arrangement. The coefficients are determined taking into account the geometric arrangement of the test antenna, the plurality of measuring probes and the parasitic emitters and an assumed far field spread. The laws of geometrical optics are advantageously taken as a basis.

The coefficients are also determined taking into account the geometric arrangement of the components involved using the means constructed for this purpose of the arrangement according to the invention.

Advantageously, the plurality of measuring probes are arranged symmetrically about a plane of symmetry which is arranged parallel to the reference plane and in which the test antenna is located. It is further advantageous for the plurality of measuring probes to be arranged above one another in a plane which is oriented perpendicular to the reference plane. As explained above, the parasitic emitters are arranged so as to be distributed between the test antenna and the measuring probes. The solution of the equation system produced from the measurement values provides, in addition to the radiation amplitudes of the parasitic emitters, the desired radiation amplitude of the direct signal portion of the test antenna.

It is further advantageous for the angular range in which the measuring probes are arranged with respect to the test antenna to be selected in such a manner that the directional graph within the angular range is constant within a predetermined pivoting width. Generally, this provision is complied with to a sufficient degree in free field measuring systems with a large distance between the test antenna and the measuring probes.

If the angular range in which the measuring probes are arranged about the test antenna is not selected in such a manner that the radiation amplitude is constant within the angular range within a predetermined fluctuation width, there may be provision for an equation system for an in particular complete section through the antenna graph of the test antenna to be produced and solved by taking into account changes of the antenna graph within the angular range about the measuring probes.

The invention is explained below with reference to an embodiment.

BRIEF DESCRIPTION OF THE DRAWINGS

The single FIGURE illustrates an arrangement according to the invention for far field measurement of a free space antenna graph.

DETAILED DESCRIPTION

An antenna ANT to be tested, referred to below as the test antenna, is arranged at a height $h_t$ above a reference plane B. The reference plane B is represented, for example, by a planar base surface, but with occurrences of unevenness in the base also being allowed. At a distance $d_1$ from the test antenna ANT, there are provided above one another, for example, four measuring probes MS1, MS2, MS3, MS4 which are arranged in a perpendicular direction relative to the reference plane B. The measuring probe MS1 is arranged in this instance at a height $h_{r1}$ above the reference plane B. The measuring probe MS2 is arranged at a height $h_{r2}$ above the reference plane B. Accordingly, the measuring probes MS3, MS4 are arranged at a height $h_{r3}$ or $h_{r4}$ above the reference plane B. In this instance, the measuring probes MS1, MS2, MS3, MS4 are arranged symmetrically, for example about a plane of symmetry which is arranged parallel to the reference plane, in which the test antenna ANT is located. This means: $(h_{r1}+h_{r4})/2=(h_{r2}+h_{r3})/2-h_t$.

Between the test antenna ANT and the measuring probes MS1, MS2, MS3, MS4, parasitic emitters PS2, PS3, PS4 act as representatives for scatter field portions of the measuring signal produced on the ground. The parasitic emitters PS2, PS3, PS4 are assumed for the remainder of the operation to be at a known distance $h_{tp}$ below the reference plane B. The parasitic emitters PS2, PS3 and PS4 are further assumed to be at a known distance $d_2$, $d_3$ and $d_4$ relative to the measuring probes MS1, MS2, MS3 and MS4.

The method according to the invention is based on a parametric model, based on which the scatter field portions caused by the ground can be suppressed or eliminated. To this end, using all the measuring probes MS1, MS2, MS3, MS4, a measurement is taken of the transmission characteristics relative to the test antenna. This is represented in the figures by respective voltage values $U_1$, $U_2$, $U_3$, $U_4$. The signal portions scattered on the ground are represented by the assumed parasitic emitters PS2, PS3, PS4 with unknown radiation magnitude and phase. Based on the measurement with the measuring probes MS1, MS2, MS3, MS4, the prevailing scatter properties of the ground which change over time are taken into consideration.

The method is consequently based on assuming parasitic emitters at known positions below the reference plane B, the radiation amplitude and phase of which is unknown. Notionally, after introducing the parasitic emitters, the ground can be removed since the scatter contribution is provided by the parasitic emitters PS2, PS3, PS4. In this regard, it is advantageous for the test antenna ANT not to be substantially coupled to the ground, which can be ensured by an adequately large height $h_t$.

In the embodiment, n=3 parasitic emitters PS2, PS3, PS4 were assumed by way of example, it also being possible in principle to select a different number of parasitic emitters. The entire field is therefore composed of the free space field of the transmitting antenna and the contributions of the parasitic emitters PS2, PS3, PS4. This means that at least n+1=3+1=4 linearly independent measurement values, that is to say one for each of the measuring probes MS1, MS2, MS3, MS4, must be received, from which a linear equation system can be produced which allows the directional graph value of the test antenna ANT and the radiation amplitudes of the three parasitic emitters PS2, PS3, PS4 to be determined.

The coefficients of the equation system can be determined with reference to the known geometry data (there are known the height $h_t$ of the antenna ANT above the reference plane B, the heights $h_{r1}$, $h_{r2}$, $h_{r3}$, $h_{r4}$ of the measuring probes MS1, MS2, MS3, MS4 above the reference plane B, the distance $d_1$ between the test antenna ANT and the measuring probes MS1, MS2, MS3, MS4 and the distances $d_2$, $d_3$, $d_4$ between the parasitic emitters PS2, PS3, PS4 and the measuring probes MS1, MS2, MS3, MS4, respectively) assuming a far field spread and application of the laws known from geometrical optics. The coefficients of the equation system can also be determined with more complex calculation methods.

The solution of the equation system provides, in addition to the emission amplitudes of the parasitic emitters PS2, PS3, PS4, the desired directional graph value of the test antenna ANT in the direction towards the measuring probes MS1, MS2, MS3, MS4. In this instance, it is assumed that the angular difference at which the test antenna ANT sees the individual measuring probes MS1, MS2, MS3, MS4, is so small that the directional graph of the test antenna ANT does not change in this angular range.

If this assumption is incorrect, a complete section of the antenna graph can be taken into consideration and an equation system can be considered for all the considered scanning points of the section.

The costs for implementing the method are low. A high use-to-cost ratio is achieved. In particular, the method is substantially independent of the measurement bandwidth in comparison with the methods known from the prior art, which often operate with adequate precision only for very large or very small measurement bandwidths.

LIST OF REFERENCE NUMERALS

ANT Test antenna
MS1 Measuring probe
MS2 Measuring probe
MS3 Measuring probe
MS4 Measuring probe
PS2 Parasitic emitter
PS3 Parasitic emitter
PS4 Parasitic emitter
B Reference plane
$H_t$ Height
$h_{r1}$ Height
$h_{r2}$ Height
$h_{r3}$ Height
$h_{r4}$ Height
$h_{tp}$ Height
$d_1$ Distance between test antenna and measuring probes
$d_2$ Distance between parasitic emitter and measuring probes
$d_3$ Distance between parasitic emitter and measuring probes
$d_4$ Distance between parasitic emitter and measuring probes
$U_1$ Voltage
$U_2$ Voltage
$U_3$ Voltage
$U_4$ Voltage

What is claimed is:

1. A method of measuring a directional graph of a test antenna comprising:
   disposing a plurality of measuring probes relative to the test antenna, each being disposed at a different first predetermined height above a reference plane;
   disposing the test antenna at a second predetermined height above the reference plane;
   measuring transmission characteristics relative to the test antenna between each of the plurality of measuring probes and the test antenna;
   determining prevailing scatter characteristics of the reference plane; and
   determining the directional graph of the test antenna using the prevailing scatter characteristics.

2. The method as recited in claim 1, further comprising suppressing signal portions scattered at the reference plane with respect to a signal amplitude.

3. The method as recited in claim 1, wherein the determining of the prevailing scatter characteristics is computer-assisted, and further comprising using at least one parasitic emitter having an unknown radiation amplitude and phase as being representative of the reference plane.

4. The method as recited in claim 3, wherein the at least one parasitic emitter includes n parasitic emitters and the plurality of measuring probes includes n+1 measuring probes, and further comprising receiving n+1 linearly independent measurement values from the n+1 measuring probes, producing a linear equation system with a corresponding number of coefficients, and determining a directional graph value of the test antenna and a radiation amplitude and a phase of the n parasitic emitters using the linear equation system.

5. The method as recited in claim 4, wherein the producing a linear equation system includes determining the coefficients based on a geometric arrangement of the test antenna, the plurality of measuring probes, and the at least one parasitic emitter.

6. The method as recited in claim 1, wherein the disposing the plurality of measuring probes includes disposing the probes symmetrically about a plane of symmetry arranged parallel to the reference plane and containing the test antenna.

7. The method as recited in claim 1, wherein the disposing the plurality of measuring probes includes disposing the probes above one another in a plane orientated perpendicularly relative to the reference plane.

8. The method as recited in claim 3, further comprising disposing the at least one parasitic emitter between the test antenna and the plurality of measuring probes.

9. The method as recited in claim 1, wherein the disposing the plurality of measuring probes includes disposing the probes within an angular range about the test antenna, wherein the directional graph within the angular range is constant within a predetermined fluctuation width.

10. The method as recited in claim 9, further comprising producing an equation system for a complete section through the antenna graph of the test antenna and solving the equation system based on changes of the antenna graph within the angular range.

11. An arrangement for measuring a directional graph of a test antenna comprising:
    a plurality of measuring probes disposed relative to the test antenna, the plurality of measuring probes each disposed at different first predetermined heights above a reference plane, and wherein the test antenna is disposed at a second predetermined height above the reference plane; and
    a measuring device configured to perform a measurement of transmission characteristics relative to the test antenna between each of the plurality of measuring probes and the test antenna, and configured to determine scatter properties of the reference plane prevailing at a time the measurement is performed and to take the scatter properties into account in determining the directional graph of the test antenna.

12. The arrangement as recited in claim 11, wherein the reference plane corresponds to ground level.

13. The arrangement as recited in claim 11, wherein the measuring device is configured to suppress signal portions scattered at the reference plane with respect to a signal amplitude.

14. The arrangement as recited in claim 11, further comprising at least one parasitic emitter having an unknown radiation amplitude and phase representing the reference plane determining the scatter properties of the reference plane in a computer-assisted manner.

15. The arrangement as recited in claim 14, wherein the at least one parasitic emitter includes n parasitic emitters and the plurality of measuring probes includes n+1 measuring probes, and wherein the measuring device is configured to receive n+1 linearly independent measurement values with the n+1 measuring probes, to produce a linear equation system having a corresponding number of coefficients and to determine at least one of the directional graph of the test antenna and a signal representing an indirect signal portion of the at least one parasitic emitter from the linear equation system.

16. The arrangement as recited in claim 15, wherein the measuring device is configured to determine the coefficients based on a geometric arrangement of the test antenna, the plurality of measuring probes, and the at least one parasitic emitter.

17. The arrangement as recited in claim 11, wherein the plurality of measuring probes is disposed symmetrically about a plane of symmetry containing the test antenna and disposed parallel to the reference plane.

18. The arrangement as recited in claim 11, wherein the plurality of measuring probes are disposed above one another in a plane oriented perpendicularly relative to the reference plane.

19. The arrangement as recited in claim 14, wherein the at least one parasitic emitter is disposed so as to be distributed between the test antenna and the plurality of measuring probes.

20. The arrangement as recited in claim 11, wherein the plurality of measuring probes are disposed about the test antenna in an angular range, and wherein the angular range is selected such that the directional graph within the angular range is constant within a predetermined fluctuation width.

21. The arrangement as recited in claim 11, wherein the measuring device is configured to produce an equation system for an in particular complete section through the directional graph of the test antenna and to solve the equation system based on changes of the antenna graph within the angular range about the plurality of measuring probes.

* * * * *